United States Patent
Huo et al.

(10) Patent No.: US 9,000,409 B2
(45) Date of Patent: Apr. 7, 2015

(54) 3D SEMICONDUCTOR MEMORY DEVICE AND MANUFACTURING METHOD THEREOF

(75) Inventors: Zongliang Huo, Beijing (CN); Ming Liu, Beijing (CN)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 102 days.

(21) Appl. No.: 13/376,276

(22) PCT Filed: Jun. 30, 2011

(86) PCT No.: PCT/CN2011/076674
§ 371 (c)(1),
(2), (4) Date: Dec. 5, 2011

(87) PCT Pub. No.: WO2012/083672
PCT Pub. Date: Jun. 28, 2012

(65) Prior Publication Data
US 2012/0161094 A1 Jun. 28, 2012

(30) Foreign Application Priority Data

Dec. 22, 2010 (CN) .......................... 2010 1 0599602

(51) Int. Cl.
*H01L 47/00* (2006.01)
*H01L 27/24* (2006.01)
*H01L 45/00* (2006.01)

(52) U.S. Cl.
CPC .......... *H01L 27/249* (2013.01); *H01L 27/2454* (2013.01); *H01L 45/04* (2013.01); *H01L 45/06* (2013.01); *H01L 45/1226* (2013.01); *H01L 45/144* (2013.01); *H01L 45/146* (2013.01); *H01L 45/147* (2013.01)

(58) Field of Classification Search
USPC .............. 438/238; 257/4, E45.001, E21.645, 257/379, E27.081; 365/63, 158, 173, 203
See application file for complete search history.

(56) References Cited

U.S. PATENT DOCUMENTS

| | | | |
|---|---|---|---|
| 5,874,760 A * | 2/1999 | Burns et al. | 257/315 |
| 6,387,758 B1 * | 5/2002 | Yu et al. | 438/269 |
| 6,740,921 B2 * | 5/2004 | Matsuoka et al. | 257/302 |

(Continued)

FOREIGN PATENT DOCUMENTS

| | | |
|---|---|---|
| CN | 1930686 A | 3/2007 |
| CN | 101794862 A | 8/2010 |

OTHER PUBLICATIONS

International Search Report from PCT/CN2011/076674 dated Oct. 13, 2011 (4 pages).

(Continued)

*Primary Examiner* — Mohammad Islam
*Assistant Examiner* — Ankush Singal
(74) *Attorney, Agent, or Firm* — Osha Liang LLP

(57) ABSTRACT

The present application discloses a 3D semiconductor memory device having 1T1R memory configuration based on a vertical-type gate-around transistor, and a manufacturing method thereof. A on/off current ratio can be well controlled by changing a width and a length of a channel of the gate-around transistor, so as to facilitate multi-state operation of the 1T1R memory cell. Moreover, the vertical transistor has a smaller layout size than a horizontal transistor, so as to reduce the layout size effectively. Thus, the 3D semiconductor memory device can be integrated into an array with a high density.

12 Claims, 10 Drawing Sheets

Cross-Sectional View Along Bit Line

(56) References Cited

U.S. PATENT DOCUMENTS

| | | | |
|---|---|---|---|
| 7,324,372 B2 * | 1/2008 | Hanzawa et al. | 365/173 |
| 7,335,580 B1 * | 2/2008 | Buerger et al. | 438/584 |
| 8,013,317 B2 * | 9/2011 | Kiyotoshi | 257/2 |
| 8,238,132 B2 * | 8/2012 | Kitagawa | 365/51 |
| 8,269,207 B2 * | 9/2012 | Toda | 257/2 |
| 8,300,454 B2 * | 10/2012 | Kramer et al. | 365/171 |
| 2006/0043471 A1 * | 3/2006 | Tang et al. | 257/328 |
| 2007/0020819 A1 * | 1/2007 | Tang et al. | 438/137 |
| 2007/0295995 A1 * | 12/2007 | Yun et al. | 257/202 |
| 2008/0062736 A1 * | 3/2008 | Hanzawa et al. | 365/63 |
| 2008/0175032 A1 * | 7/2008 | Tanaka et al. | 365/51 |
| 2008/0179659 A1 * | 7/2008 | Enda et al. | 257/326 |
| 2009/0097300 A1 * | 4/2009 | Ishihara et al. | 365/148 |
| 2009/0121271 A1 * | 5/2009 | Son et al. | 257/315 |
| 2009/0279349 A1 * | 11/2009 | Shih et al. | 365/163 |
| 2010/0117054 A1 | 5/2010 | Kim et al. | |
| 2010/0219392 A1 * | 9/2010 | Awaya et al. | 257/3 |
| 2010/0237423 A1 * | 9/2010 | Yun et al. | 257/368 |
| 2010/0259970 A1 * | 10/2010 | Toda et al. | 365/148 |
| 2011/0159645 A1 * | 6/2011 | Pekny | 438/129 |
| 2011/0163390 A1 * | 7/2011 | Sandhu | 257/401 |
| 2011/0284817 A1 * | 11/2011 | Sasago et al. | 257/5 |
| 2011/0292715 A1 * | 12/2011 | Ishihara et al. | 365/148 |
| 2012/0070944 A1 * | 3/2012 | Kim et al. | 438/128 |

OTHER PUBLICATIONS

Written Opinion from PCT/CN2011/076674 dated Oct. 13, 2011 (4 pages).

First Office Action dated Jul. 4, 2013, issued by the State Intellectual Property Office of China, in related Chinese Patent Application No. CN-201010599602.5, with a partial English translation (6 pages).

* cited by examiner

Cross-Sectional View Along Bit Line

US 9,000,409 B2

3D SEMICONDUCTOR MEMORY DEVICE AND MANUFACTURING METHOD THEREOF

TECHNICAL FIELD

The present invention relates to microelectronic technology, and more particularly, to a non-volatile high-density 3D semiconductor memory device and a manufacturing method thereof.

BACKGROUND

The Semiconductor memory technology is a key one in the microelectronic technology. With the information technology's focus changing from network and computation to storage, researches on the memory technology are becoming a critical research direction in the information technology. Current researches on the memory technology mainly focus on a high-density, high-performance non-volatile FLASH. As a semiconductor device is scaled down, the conventional FLASH technology encounters much severer technical difficulties such as crosstalk, low write-in speed etc. It is difficult to meet the requirement of the memory technology at 20 nm technology node and beyond. Therefore, it is desirable to develop new memory technology to meet mass storage requirements.

Recently, a variable resistance memory technology attracts many researchers' attention. The variable resistance memory technology is believed to be a key technology at 20 nm technology node and beyond. A resistance random access memory (RRAM) distinguishes two states by a reversible conversion of the storage medium between a high resistance and a low resistance under the effect of an electric signal.

The memory cell has a structure formed by successively stacking three layers of an upper electrode, a variable resistance material and a lower electrode. Such a memory cell is advantageous because it has a simple structure, can be easily manufactured and compatible with the prior CMOS process. 3D integration of variable resistance memory cells may achieve high density storage of data, and may be used in various applications such as solid state disk.

Due to a crosstalk effect between the variable resistance memory cells in a conventional cross-bar configuration, the conventional variable resistance memory technology needs to use a diode or a section transistor to select a memory cell. 1D1R and 1T1R are two typical memory configurations. 3D variable resistance memory is 3D integration in the two typical memory configurations. FIG. 1 is a schematic diagram of a semiconductor memory device in 1D1R configuration in the prior art. As shown in FIG. 1, although the 1D1R type 3D variable resistance memory device may increase a storage density to some extent, it can not bring an apparent change in a height of the memory cell because a diode in the memory cell consists of a PN junction. The conventional PN junction has a height larger than 100 nm. Moreover, a layer of intrinsic silicon is used in the PN junction so as to increase a positive bias current and suppress a negative bias current. Furthermore, a metal barrier layer is used for suppressing interdiffusion of metal in a metal electrode and P-type silicon. These additional layers increase a thickness of the memory cell, and hinder an arrangement of the memory cells in multiple levels. For example, it is difficult to perform etching on a multilayer structure. More importantly, in a case that the memory cells are stacked in multiple levels, ion implantation for forming the PN junction and subsequent activation of impurities should be performed at a relatively high temperature. Performances of previously-formed memory cells may be affected when forming subsequent memory cells, which is disadvantageous for high reliable operation of the memory device. Therefore, the 1T1R type 3D memory technology may have a greater potential in high-density integration than the 1D1R type 3D variable resistance memory. For example, more levels of memory cells may be integrated in the 1T1R type 3D memory technology by adjusting the thicknesses of respective storage layers.

FIG. 2 is a schematic diagram of the 1T1R type semiconductor memory device with a right and a left electrodes in the prior art. FIG. 3 is a schematic diagram of the 1T1R type semiconductor memory device with an upper and a lower electrodes in the prior art. As shown in FIGS. 2 and 3, a storage area is accessed by using a selection transistor, regardless of the variable resistance unit structure with the right and the left electrodes or the variable resistance unit structure with the upper and the lower electrodes, in the 1T1R type 3D memory technology. It requires that the selection transistor has a large on/off ratio, wherein a large on-state current is used for programming and a low off-state current is used for avoiding crosstalk. However, the implementation of the large on/off ratio departs from the requirement of reducing a layout size of the transistor in the high-density integration of the 3D memory device. Therefore, the conventional 3D structure must seek tradeoff between the density and performances, which is not a good solution. Similar to a DRAM with a conventional 1T1C structure, the dimension of a single selection transistor will be a bottleneck for a further reduction in scaling down.

The inventor recognized that the prior approaches in the 3D semiconductor memory device had the drawback that the transistor could not have a large on/off ratio while having a reduced layout size of the transistor.

SUMMARY OF THE DISCLOSURE

Technical Problem to be Solved

To overcome the above drawback in the prior art, the present disclosure provides a 3D semiconductor memory device and a manufacturing method thereof, so that a transistor with a smaller size may have a on/off ratio as large as possible.

II. Technical Solutions

According to one aspect of the present disclosure, there is provided a 3D semiconductor memory device. The 3D semiconductor memory device comprises a substrate, and a memory array consisting of one or more of memory cells located on the substrate, each string of memory cells comprising a vertical-type gate-around transistor and a vertical annular variable resistance unit. In a bit line direction, the vertical-type gate-around transistors of the adjacent vertical strings of memory cells have a common source region, gates of the vertical-type gate-around transistors are isolated by an insulating layer, and upper electrodes of the vertical annular variable resistance units are isolated by an insulating layer, the common source region functioning as the bit line of the string of memory cells. In a word line direction, the source regions of the vertical-type gate-around transistors of the adjacent vertical strings of memory cells are isolated by a shallow trench isolation, the gates of the vertical-type gate-around transistors are connected to each other, and the upper electrodes of the vertical annular variable resistance units are connected to each other.

Preferably, in the present disclosure, the vertical-type gate-around transistor comprises; the source region formed on the substrate; a channel region formed on the source region perpendicular to the substrate; a drain region formed between the channel region and the vertical annular variable resistance unit; and a gate insulating layer and a gate, which are successively formed on a side surface of the channel region.

Preferably, in the present disclosure, the vertical annular variable resistance unit comprises one or more annular resistance sub-units arranged in a vertical direction. The annular resistance sub-unit comprises: a lower electrode formed on the drain of a respective vertical-type gate-around transistor, the one or more annular resistance sub-units corresponding to one vertical-type gate-around transistor having a common lower electrode; a variable resistance function layer formed at a predetermined position on a side surface of the lower electrode, for distinguishing information states; and an upper electrode formed on the variable resistance function layer, the upper electrodes of respective layers of the vertical annular variable resistance unit being insulated from each other, the upper electrodes of the annular resistance sub-units of the adjacent vertical annular variable resistance units being insulated from each other in the bit line direction and having a common connection to outside of the array in the word line direction.

Preferably, in the present disclosure, in the vertical-type gate-around transistor, the source region is formed by ion implantation, or by forming a metal silicide, or by a buried metal layer; the channel region is formed by etching the substrate, or by epitaxial growth or a deposition process; the gate is formed by a "gate-first" process in which the gate is formed before formation of the channel, or by a "gate-last" process in which the channel is formed before formation of the gate; the gate dielectric layer is formed by a deposition process; and the drain region is formed by ion implantation, or by a silicidation process, or by a metal deposition process.

Preferably, in the present disclosure, the channel region is made of one selected from a group consisting of silicon, polysilicon and germanium; the gate is made of one selected from a group consisting of polysilicon, metal and metal silicide; and the gate dielectric layer is made of one selected from a group consisting of $SiO_2$ and SiON.

Preferably, in the present disclosure, the lower electrode comprises a single-layer metal, or a bilayer structure of a metal passivation layer and a metal layer; a variable resistance function layer is formed by depositing a single-layer variable resistance material or a multi-layer variable resistance material, and is implemented by phase change of the material of the variable resistance function layer.

According to another aspect of the present disclosure, there is provided a method for manufacturing a 3D semiconductor memory device. The method comprises: forming a vertical-type gate-around transistor on a substrate; and forming a vertical annular variable resistance unit on the substrate on which the vertical-type gate-around transistor has been formed, so that manufacture of the 3D semiconductor memory device is completed.

Preferably, in the present disclosure, the step of forming the vertical-type gate-around transistor on the substrate comprises: forming a shallow trench isolation on the substrate to define a bit line area; forming a bit line on the bit line area by ion implantation or a silicidation process; depositing a stack of $SiO_2$ insulating layer/SiN sacrificial layer/$SiO_2$ insulating layer on the substrate on which the bit line has been formed; forming a via hole by etching the bit line area of the substrate on which the stack of $SiO_2$/SiN/$SiO_2$ is deposited, so as to define a channel region; forming a channel by epitaxial growth on the substrate on which the channel region is defined, or forming a channel region in the via hole area by deposition and annealing; forming a drain region by ion implantation; etching the substrate on which the drain region is formed, so as to define a word line area; removing the SiN sacrificial layer from the substrate on which the word line area is formed; depositing and etching back the gate dielectric and the gate by a gate-last process on the substrate on which the SiN sacrificial layer is removed; and depositing an interlayer dielectric.

Preferably, in the present disclosure, before the step of etching and defining the word line area, the method further comprises, forming a low-resistance drain contact region by deposition of metal and silicidation.

Preferably, in the present disclosure, the step of forming the vertical annular variable resistance unit on the substrate on which the vertical-type gate-around transistor has been formed comprises: alternatively depositing a plurality of the insulating layers and the sacrificial layers SiN, and defining a size of the variable resistance unit by a thickness, a number of the layers of the sacrificial layers corresponding to a number of a annular resistance sub-units; defining a lower electrode area of the variable resistance unit by etching through the via hole, the lower electrode area connecting downwards to the drain of the vertical-type gate-around transistor; depositing a metal passivation layer and lower electrode metal in the via hole; etching the stack in a word line direction to define a size of an upper electrode of the variable resistance unit; removing the SiN sacrificial layer; depositing the variable resistance function layer and the upper electrode, and etching back to provide isolation between units; and depositing the interlayer dielectric, and providing metal wires III. Beneficial Effects The present disclosure provides a 3D semiconductor memory device in 1T1R memory configuration with a vertical-type gate-around transistor. The vertical transistor has a smaller layout size than a horizontal transistor. Moreover, a on/off current ratio can be well controlled by changing a width and a length of a channel of the gate-around transistor.

DETAILED DESCRIPTION

Figure 1:
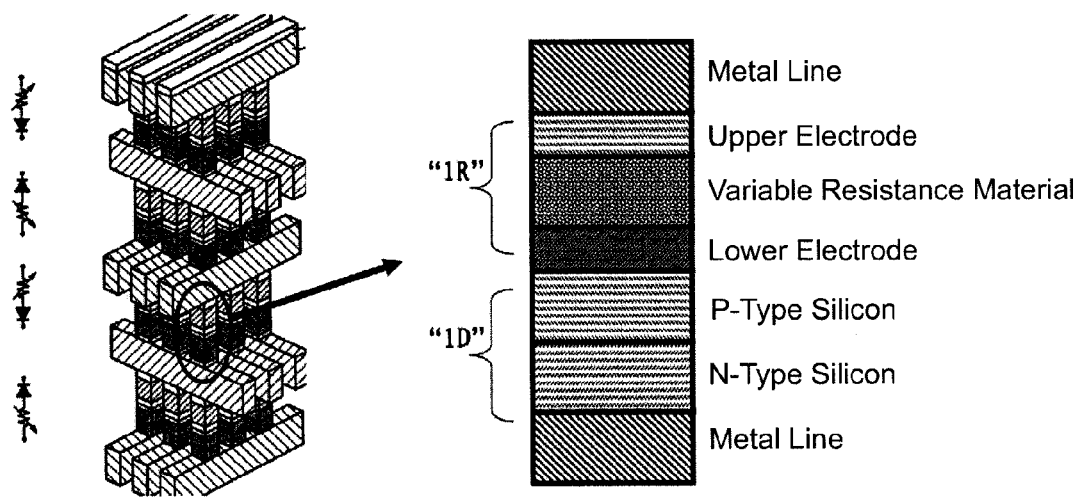
FIG. 1 is a schematic diagram of a semiconductor memory device in 1D1R configuration in the prior art.

The disclosure will be further illustrated in detail in the following embodiments in conjunction with the accompanying drawings, so that the object, solution and advantages of the present disclosure are more apparent.

The present disclosure discloses a 3D semiconductor memory device, comprising; a substrate, and a memory array consisting of one or more of memory cells located on the substrate, each string of memory cells comprising a vertical-type gate-around transistor and a vertical annular variable resistance unit, wherein in a bit line direction, the vertical-type gate-around transistors of the adjacent vertical strings of memory cells have a common source region, gates of the vertical-type gate-around transistors are isolated by an insulating layer, and upper electrodes of the vertical annular variable resistance units are isolated by the insulating layer, the common source region functioning as the bit line of the strings of memory cells; in a word line direction, the source regions of the vertical-type gate-around transistors of the adjacent vertical strings of memory cells are isolated by a shallow trench isolation, the gates of the vertical-type gate-around transistors are connected to each other, and the upper electrodes of the vertical annular variable resistance units are connected to each other. The gates connected to each other function as the word line of the strings of memory cells.

In another embodiments, the vertical-type gate-around transistor comprises; the source region formed on the substrate; a channel region formed on the source region perpendicular to the substrate; a drain region formed between the channel region and the vertical annular variable resistance unit; and a gate insulating layer and a gate, which are successively formed on a side surface of the channel region.

The present disclosure provides a 3D semiconductor memory device having 1T1R memory configuration based on a vertical-type gate-around transistor. The 3D semiconductor memory device can control on/off current ratio by changing a channel width and a channel length of the gate-around transistor, so as to facilitate multi-state operation of the 1T1R memory cell. Moreover, the vertical transistor has a smaller layout size than a horizontal transistor. For example, a conventional bit line contact is disposed under the transistor, so as to reduce the layout size effectively. Thus, the 3D semiconductor memory device can be integrated into an array with a high density.

In the present disclosure, the vertical annular variable resistance unit comprises one or more annular resistance sub-units arranged in a vertical direction. The annular resistance sub-unit comprises; a lower electrode formed on the drain of a respective vertical-type gate-around transistor, the one or more annular resistance sub-units corresponding to one vertical-type gate-around transistor having a common lower electrode; a variable resistance function layer formed at a predetermined position on a side surface of the lower electrode, for distinguishing information states; and an upper electrode formed on the variable resistance function layer, the upper electrodes of respective layers of the vertical annular variable resistance unit being insulated from each other, the upper electrodes of the annular resistance sub-units of the adjacent vertical annular variable resistance units being insulated from each other in the bit line direction and having a common connection to outside of the array in the word line direction.

Figure 4:
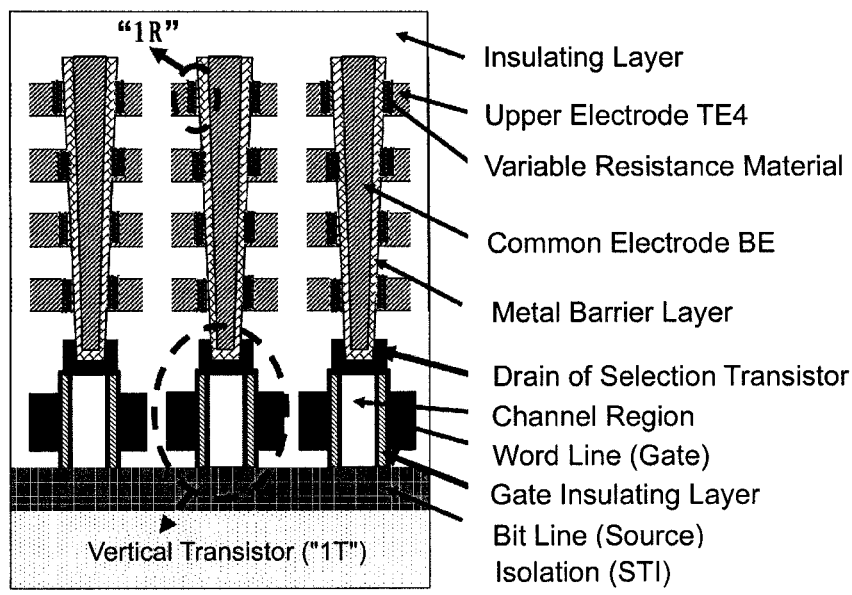
FIG. 4 is a schematic diagram of a 3D semiconductor memory device in a bit line direction according to an embodiment of the present disclosure.
Figure 5:
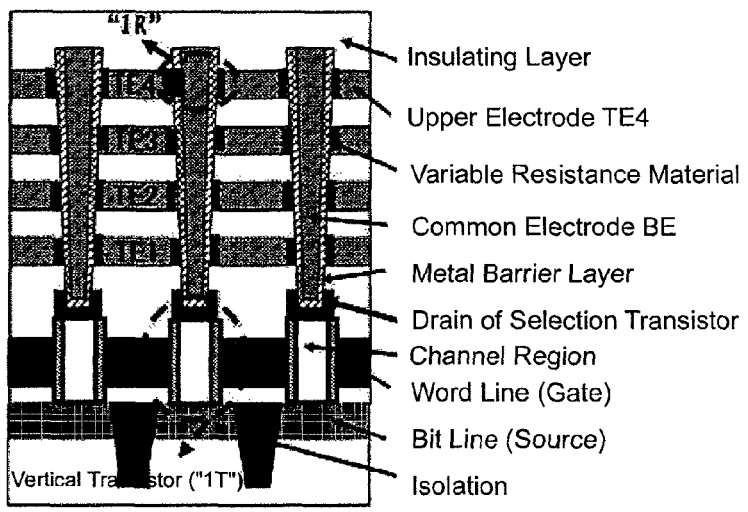
FIG. 5 is a schematic diagram of a 3D semiconductor memory device in a word line direction according to an embodiment of the present disclosure.

Hereinafter, an embodiment of the present disclosure is provided to illustrate the present disclosure. In the present disclosure, each of the string of memory cells may consist of one vertical-type gate-around transistor and a string of vertical annular variable resistance units. FIG. 4 is a schematic diagram of a 3D semiconductor memory device in a bit line direction according to an embodiment of the present disclosure. As shown in FIG. 4, in the bit line direction, different strings may share one low-resistant source region of a transistor, and the transistor gates and the electrodes of the variable resistance material may be isolated by the insulating layer. FIG. 5 is a schematic diagram of a 3D semiconductor memory device in a word line direction according to an embodiment of the present disclosure. As shown in FIG. 5, in the word line direction, the source regions of each sting may be isolated by the shallow trench isolation, and the gates of the selection transistors between respective strings may be connected to the upper electrodes of the variable resistance units of respective levels, so as to provide an access interface of the array outside the array.

The vertical-type surrounding gate transistor (IT) in the present disclosure may comprise;

the source, which is also be the bit line of the memory array, the bit line being formed by ion implantation, or by forming a metal siliside, or by a buried metal layer;

the channel, which may be formed by etching the original silicon substrate, or by epitaxial growth or a deposition process; the channel may be made of one selected from a group consisting of silicon, polysilicon, germanium and other materials used for the transistor channel region;

the gate, which may be formed by a "gate-first" process in which the gate is formed before formation of the channel, i.e. firstly forming the gate and then forming the source and the drain, or by a "gate-last" process in which the channel is formed before formation of the gate, i.e. firstly forming a dummy gate and then forming the source and drain; the material of which may be one selected from a group consisting of polysilicon, metal, metal silicide etc.

a gate dielectric layer, which may be conventional $SiO_2$ or $SiO_xN_y$, and may also be made of a high dielectric constant material;

the drain, which may be formed by ion implantation, or by a silicidation process, or by a metal deposition process etc. The drain will be connected to a lower electrode of a memory cell.

Figure 6:
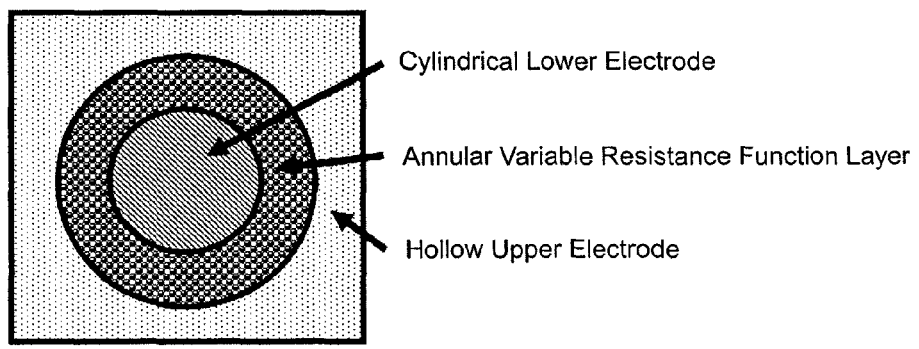
FIG. 6 is a cross-sectional view of a single variable resistance memory cell in a 3D semiconductor memory device according to an embodiment of the present disclosure.

FIG. 6 is a cross-sectional view of a single variable resistance memory cell in a 3D semiconductor memory device according to an embodiment of the present disclosure. Referring to FIGS. 4-6, each of the vertical annular variable resistance units ("1R") in the present disclosure may comprise;

a lower electrode, wherein the lower electrodes of respective memory cells may have a common connection to a drain region of the access transistor of the string; the lower electrode may comprise a single-layer metal, or a bilayer structure of a metal passivation layer and a metal layer; And the material of the lower electrode may be a metal material such as Ag, Au, Cu, W, Ti, Pt, Ti, Ta, and may also include materials such as TiN, TaN, WN.

a variable resistance function layer, which may surround the cylindrical lower electrode to form a annular structure; the variable resistance function layer will provide a capability of distinguishing information states, including (1) The variable resistance function layer may be formed by depositing a single-layer variable resistance material or a multi-layer variable resistance materials. For example, the material of the variable resistance function layer may be a complex oxide, such as $Pr_{1-x}Ca_xMnO_3(0<x<1)$, or perovskite materials $SrTiO_3$ and $SrZrO_3$ etc., or a binary transition metal oxide such as $HfO_2$, $CuO_2$, $TiO_2$, $ZrO_2$, $NiO_x(0<x<2)$, $Nb_2O_5$, MoO, etc., or any combination thereof.

(2) Transition of a resistance state may also be implemented by phase change of the material of the variable resistance function layer (i.e. a conventional phase change memory). Therefore, the material of the variable resistance function layer may also include various materials which may change their phase, e.g. $Ge_2Sb_2Te_5$(GST), GeTe, GeTeC etc.

an upper electrode, wherein the upper electrodes of respective layers of the vertical storage string may be insulated from each other, and respective strings may be insulated from each other in the bit line direction, but may have a common connection to the outside of the array; the upper electrode may have a single-layer or a bilayer structure of metals, such as Ag, Au, Cu, W, Ti, Pt, Ti, Ta, or may also include the material TiN, TaN, WN etc., and any combination thereof.

Figure 7:
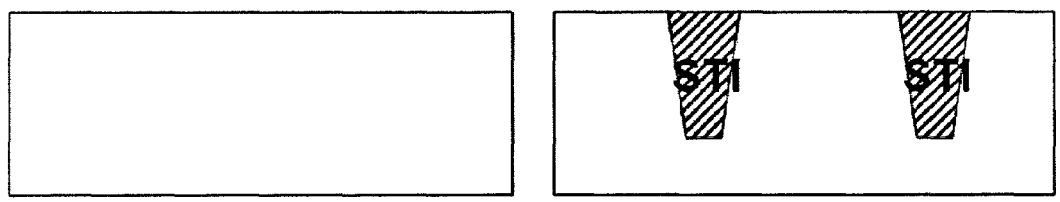
FIG. 7 is a schematic diagram of a device structure after the step of defining a bit line is performed in a method for manufacturing a 3D semiconductor memory device according to an embodiment of the present disclosure.
Figure 8:
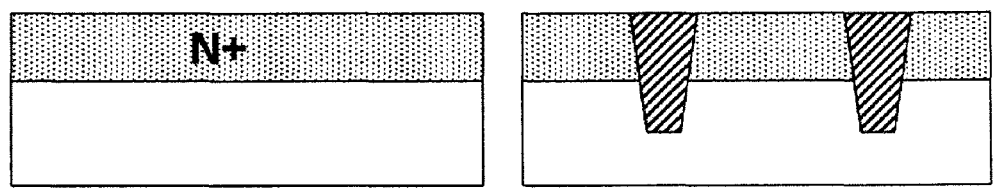
FIG. 8 is a schematic diagram of a device structure after the step of forming a low-resistant bit line is performed in a method for manufacturing a 3D semiconductor memory device according to an embodiment of the present disclosure.
Figure 9:
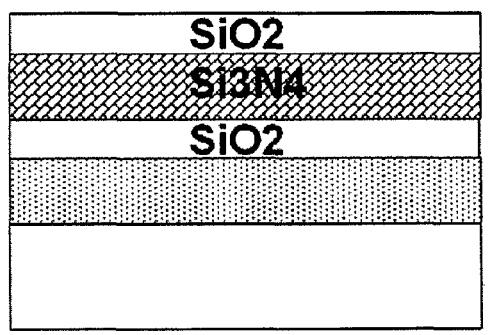
FIG. 9 is a schematic diagram of a device structure after the step of depositing a sacrificial layer is performed in a method for manufacturing a 3D semiconductor memory device according to an embodiment of the present disclosure.
Figure 10:
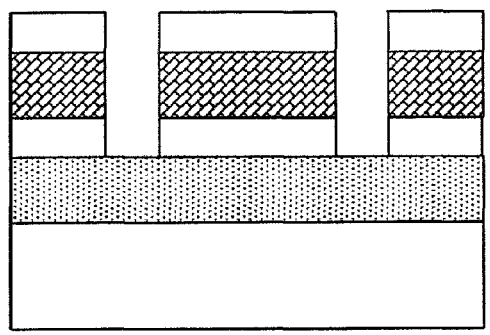
FIG. 10 is a schematic diagram of a device structure after the step of defining a channel region is performed in a method for manufacturing a 3D semiconductor memory device according to an embodiment of the present disclosure.
Figure 11:
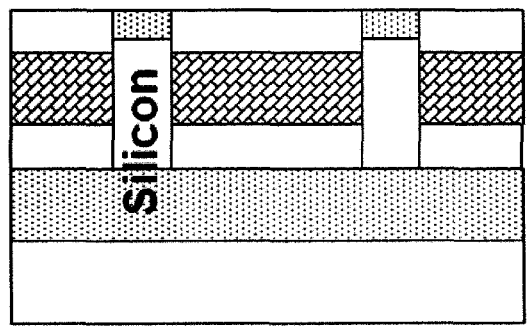
FIG. 11 is a schematic diagram of a device structure after the step of forming a drain region by ion implantation is performed in a method for manufacturing a 3D semiconductor memory device according to an embodiment of the present disclosure.
Figure 12:
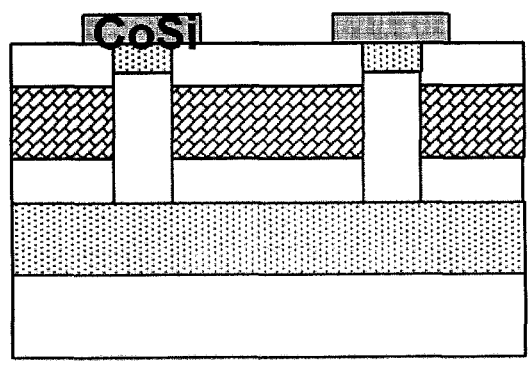
FIG. 12 is a schematic diagram of a device structure after the step of forming a low-resistance drain contact region is performed in a method for manufacturing a 3D semiconductor memory device according to an embodiment of the present disclosure.
Figure 13:
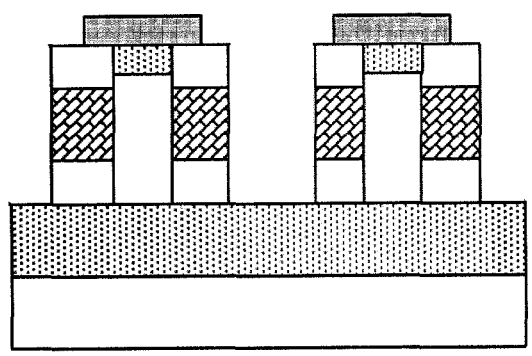
FIG. 13 is a schematic diagram of a device structure after the step of etching and defining a word line area is performed in a method for manufacturing a 3D semiconductor memory device according to an embodiment of the present disclosure.
Figure 14:
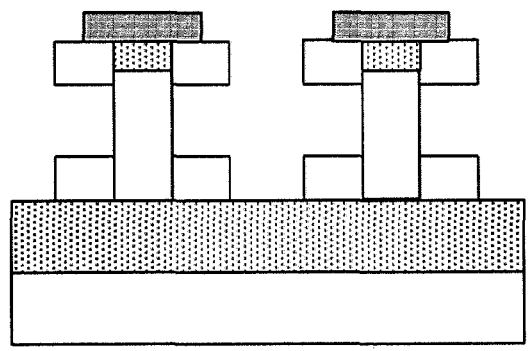
FIG. 14 is a schematic diagram of a device structure after the step of removing a SiN sacrificial layer is performed in a method for manufacturing a 3D semiconductor memory device according to an embodiment of the present disclosure.
Figure 15:
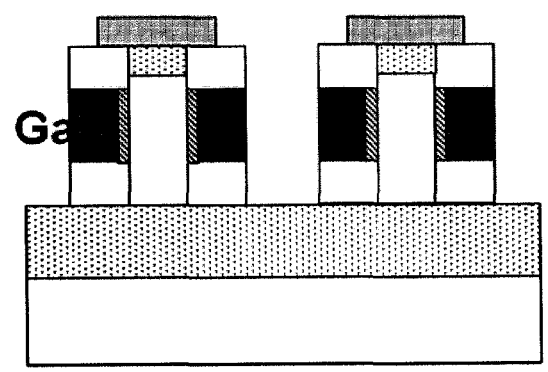
FIG. 15 is a schematic diagram of a device structure after the step of depositing and etching back a gate dielectric and a gate by a gate-last process is performed in a method for manufacturing a 3D semiconductor memory device according to an embodiment of the present disclosure.
Figure 16:
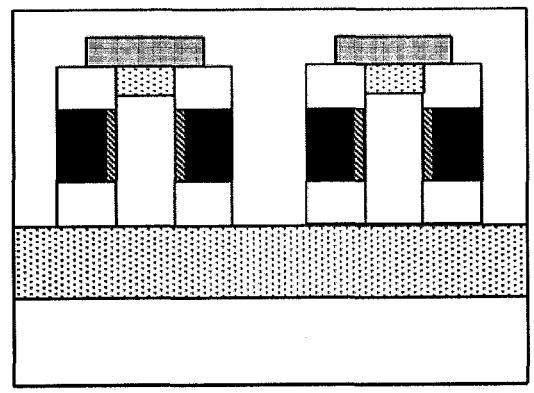
FIG. 16 is a schematic diagram of a device structure after the step of depositing an interlayer dielectric layer is performed in a method for manufacturing a 3D semiconductor memory device according to an embodiment of the present disclosure.
Figure 17:
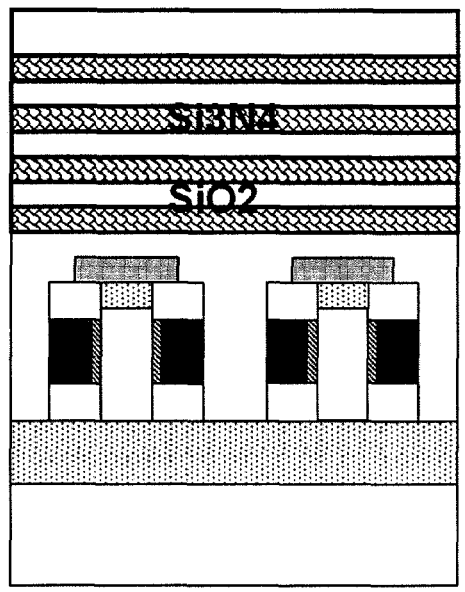
FIG. 17 is a schematic diagram of a device structure after the step of depositing a plurality of sacrificial layer dielectrics is performed in a method for manufacturing a 3D semiconductor memory device according to an embodiment of the present disclosure.
Figure 18:
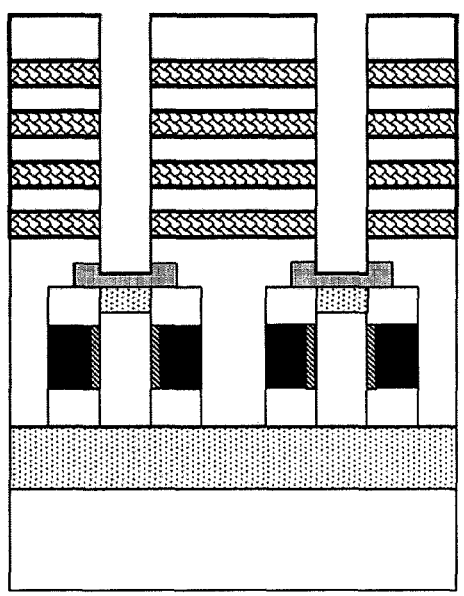
FIG. 18 is a schematic diagram of a device structure after the step of defining a lower electrode area of a variable resistance array unit by etching through a via hole is performed in a method for manufacturing a 3D semiconductor memory device according to an embodiment of the present disclosure.
Figure 19:
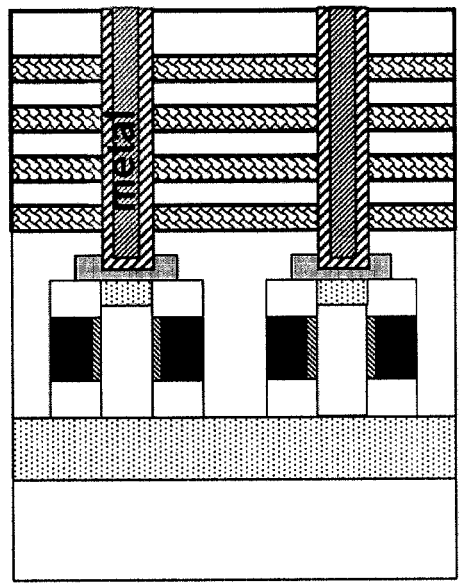
FIG. 19 is a schematic diagram of a device structure after the step of depositing a metal passivation layer and a lower electrode metal material in a via hole is performed in a method for manufacturing a 3D semiconductor memory device according to an embodiment of the present disclosure.
Figure 20:
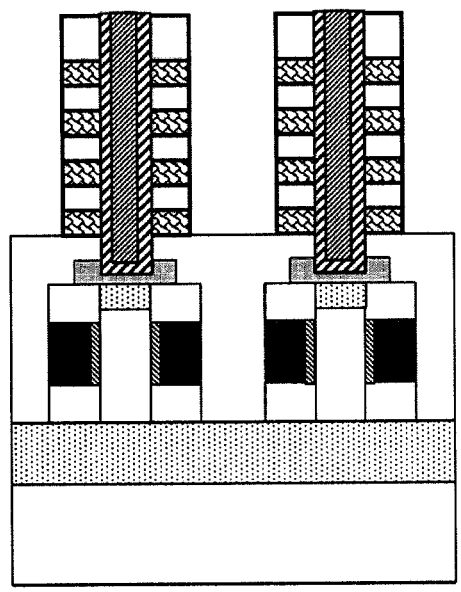
FIG. 20 is a schematic diagram of a device structure after the step of defining a size of an upper electrode of a variable resistance unit by etching a stack in a word line direction is performed in a method for manufacturing a 3D semiconductor memory device according to an embodiment of the present disclosure.
Figure 21:
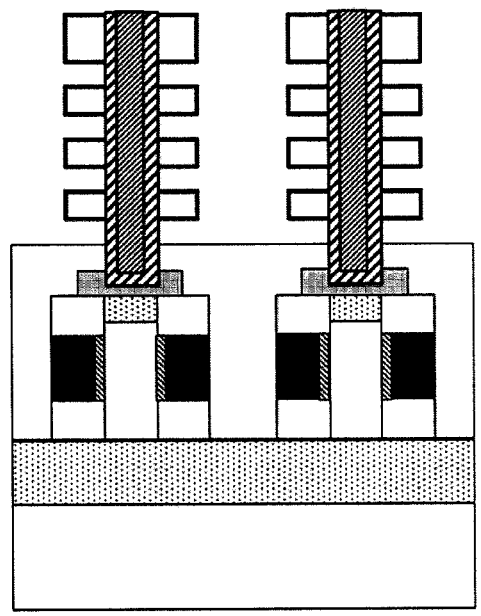
FIG. 21 is a schematic diagram of a device structure after the step of removing a SiN sacrificial layer is performed in a method for manufacturing a 3D semiconductor memory device according to an embodiment of the present disclosure.
Figure 22:
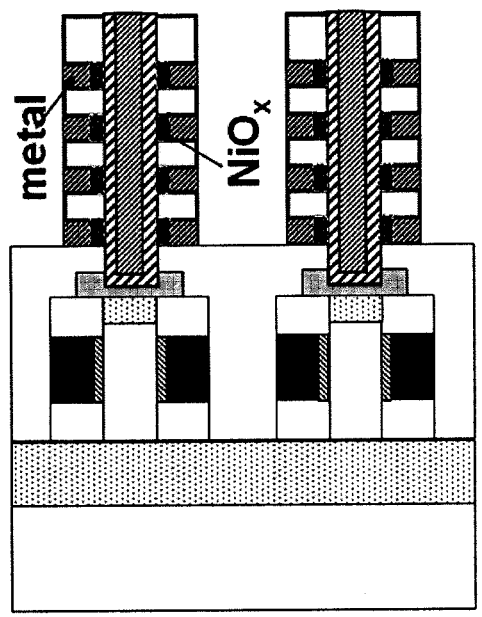
FIG. 22 is a schematic diagram of a device structure after the step of defining a bit line is performed in a method for manufacturing a 3D semiconductor memory device according to an embodiment of the present disclosure.
Figure 23A:
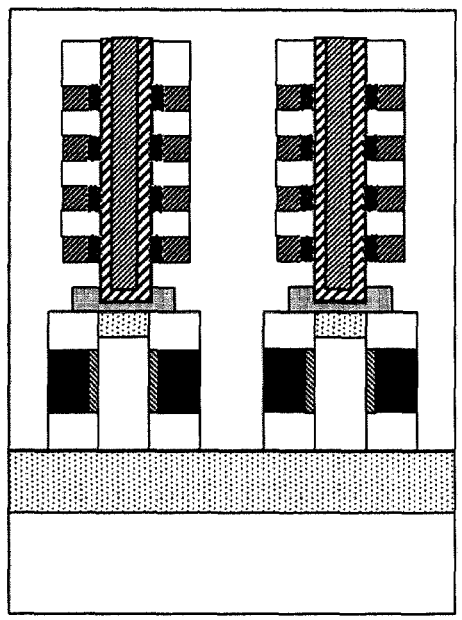
FIG. 23*a* is a cross-sectional view of a memory array area in a bit line direction in a 3D semiconductor memory device according to an embodiment of the present disclosure.
Figure 23B:
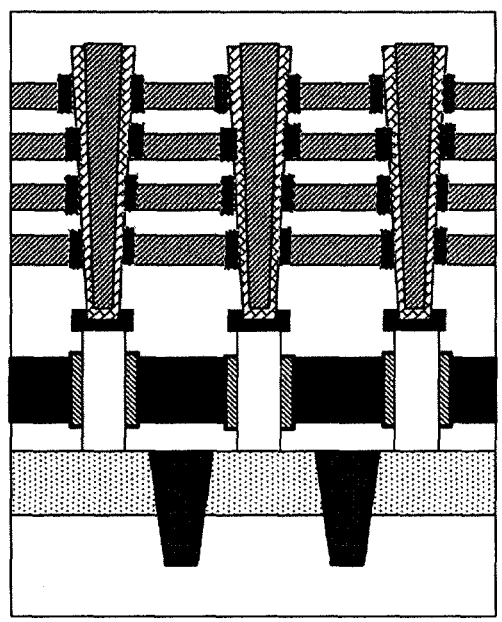
FIG. 23*b* is a cross-sectional view of a memory array area in a word line direction in a 3D semiconductor memory device according to an embodiment of the present disclosure.

In order to form the above 3D semiconductor memory device, many manufacture processes may be used. As an example, the present embodiment provides an electrode replacement process for forming the 3D semiconductor memory device. The electrode replacement process may comprise;

step S100; forming a vertical-type gate-around transistor according to the "gate-last" process, comprising sub-steps as follows;

sub-step S102; forming a shallow trench isolation to define a bit line (a source region of a selection transistor source region) area by etching silicon, backfilling $SiO_2$ and CMP on the silicon substrate; FIG. 7 shows the device structure after this step, wherein the left figure is taken in an X direction, and the right figure is taken in a Y direction;

sub-step S104; forming a low-resistant bit line by ion implantation process or the silicidation process; FIG. 8 shows the device structure after this step, wherein the left figure is taken in an X direction, and the right figure is taken in a Y direction;

sub-step S106; depositing a stack of sacrificial layer $SiO_2$/SiN/$SiO_2$; FIG. 9 shows the device structure after this step;

sub-step S108; etching and forming the a via hole on the bit line area of the substrate on which the stack of $SiO_2$/SiN/$SiO_2$ is deposited, so as to define the channel region; FIG. 10 shows the device structure after this step;

sub-step S110; forming a channel region in the via hole by epitaxial growth, or by depositing polysilicon, or by depositing amorphous silicon and then annealing; and forming a drain region by ion implantation; FIG. 11 shows the device structure after this step;

sub-step S112 (optional step); forming a low-resistance drain contact area by depositing a metal or by silicidation; FIG. 12 shows the device structure after this step;

sub-step S114; defining and forming a word line area (an un-etched portion) by etching; FIG. 13 shows the device structure after this step;

sub-step S116; removing the SiN sacrificial layer by selectively etching; FIG. 14 shows the device structure after this step;

sub-step S118; completing the deposition of the gate dielectric and the gate electrode and completing the back-etching using the gate-last process; FIG. 15 shows the device structure after this step;

sub-step S120; depositing a dielectric layer to form a inter-layer dielectric of the vertical transistor; FIG. 16 shows the device structure after this step.

step S200; implanting 3D integration of the variable resistance unit by means of electrode replacement, comprising;

sub-step S202; forming a stack by depositing dielectric materials of different etching selectivity such as $SiO_2/Si_3N_4/SiO_2/ \ldots /Si_3N_4/SiO_2$, for example by CVD; and defining a size of the variable resistance unit by thickness; FIG. 17 shows the device structure after this step;

sub-step S204; performing deep via hole etching on the stack by dry etching or by a combination of dry etching and wet etching, the via hole area being a lower electrode area of the variable resistance array unit; FIG. 18 shows the device structure after this step;

sub-step S206; depositing a metal passivation layer and a lower electrode metal material in the via hole; FIG. 19 shows the device structure after this step;

sub-step S208; etching the stack in a word line direction to define a size of the upper electrode of the variable resistance unit; FIG. 20 shows the device structure after this step;

sub-step S210; removing the SiN sacrificial layer by means of high selectivity between SiN/SiO; FIG. 21 shows the device structure after this step;

sub-step S212; forming a variable resistance function layer and an upper electrode and etching back to provide isolation between units; FIG. 22 shows the device structure after this step;

sub-step S214; finally, depositing an interlayer dielectric and performing the steps in Back-End-Of-Line, such as forming metal wires, etc.; FIG. 23a shows a cross-sectional view of a memory array area in a bit line direction in a 3D semiconductor memory device according to the embodiment of the present disclosure; and FIG. 23b shows a cross-sectional view of the memory array area in a word line direction in the 3D semiconductor memory device according to the embodiment of the present disclosure.

The vertical-type 1T1R 3D memory array is manufactured in the above steps. Of course, the variable resistance unit may also be manufactured in such a way that after forming the via hole for the lower electrode by etching (the sub-step S204), SiN is selectively and partly etched; a variable resistance material is deposited and etched back to form separated variable resistance areas; and the lower electrode is formed by deposition (the sub-step S206). After etching for the word line, the SiN is selectively removed (the sub-step S210), and an upper electrode material is deposited (the sub-step S212) so as to complete the memory cell. Operations of the 3D variable resistance memory array, such as erasing, writing and reading, may be implemented by referring to those of the 1T1R-type array based on plane transistors. The descriptions thereof are omitted.

On the basis of the above embodiments, the method for manufacturing the 3D semiconductor memory device by electrode replacement in a further embodiment may comprise;

step A; forming a shallow trench isolation on the substrate to define a bit line area (source region of a selection transistor);

step B; forming an n-type doped bit line (source region) with a high concentration on a silicon substrate by ion injection;

step C; depositing sacrificial layer SiO/SiN/SiO on the silicon substrate;

step D; forming via hole by etching the deposited SiO/SiN/SiO structure to define a channel region;

step E; forming a silicon channel region in the via hole using the epitaxial process, and then forming a drain region by ion implantation;

step F; forming a low-resistance drain contact area by a silicidation process on a drain junction region;

step G; etching and defining the SiO/SiN/SiO layer to form a gate region (an un-etched portion);

step H; removing the SiN sacrificial layer by selectively etching;

step I; depositing and etching back a gate dielectric $SiO_2$ and a gate polysilicon or a metal electrode material on the area where SiN is removed;

step J; depositing an insulating dielectric layer $SiO_2$ or HDP etc. to form an interlayer dielectric;

step K; depositing multi-layer sacrificial layer dielectrics SiO/SIN/ . . . /SiN/SiO;

Step L; performing deep through hole etching on the stack by dry etching or by a combination of dry etching and wet etching, the through hole area being a lower electrode area of the variable resistance array unit;

step M; depositing a metal passivation layer TaN and a lower electrode metal such as Pt in the via hole formed by etching;

step N; etching the stack in a word line direction to define a size of an upper electrode of the variable resistance unit;

step O; removing the SiN sacrificial layer by wet etching, by means of high selectivity between SiN/SiO;

step P; depositing and etching back a variable resistance function layer NiO and an upper electrode such as Ti where SiN has been removed so as to provide isolation between units;

step Q; depositing an interlayer dielectric $SiO_2$ and performing the steps in Back-End-Of-Line, such as forming metal wires, etc.

As seen from the above processes, although the memory configuration of the present disclosure comprises a stack of multiple memory cells, only two steps of etching are needed due to the application of a replacement electrode process. One step of etching is performed for forming a via hole for a lower electrode, and the other step of etching is performed for an upper electrode. Therefore, the manufacture process is very simple, low-cost, well compatible with the conventional silicon planar CMOS process, and can be easily and widely used in the industry applications.

The above structure only shows a stack structure of four-level memory cells. Other stack structures with different numbers (N>=1) of levels of memory cells also fall within the scope of the present disclosure. It should be noted that in the method for manufacturing the 3D semiconductor memory device of the present disclosure, the deposition processes concerned may be CVD, LPCVD, ALD, sputtering, evaporating etc; the etching processes concerned may be dry etching such as RIE, ICP, and wet etching. The skilled in the art may select suitable deposition, etching or other processes, in connection with actual practices and environment factors. All of the suitable processes should fall into the protection scope of the present disclosure, as long as they may achieve the objects of the present disclosure and implement the structure features of the present disclosure.

Figure 2:
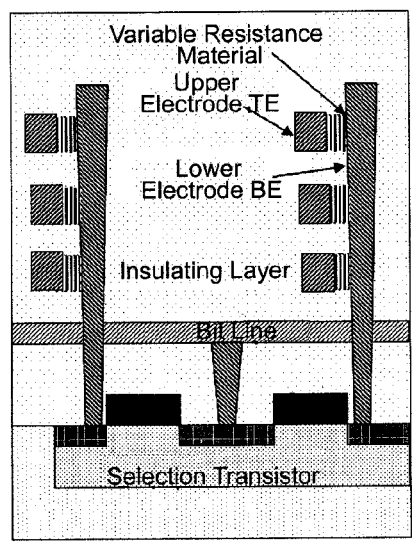
FIG. 2 is a schematic diagram of a semiconductor memory device in 1T1R configuration with a right and a left electrodes in the prior art.
Figure 3:
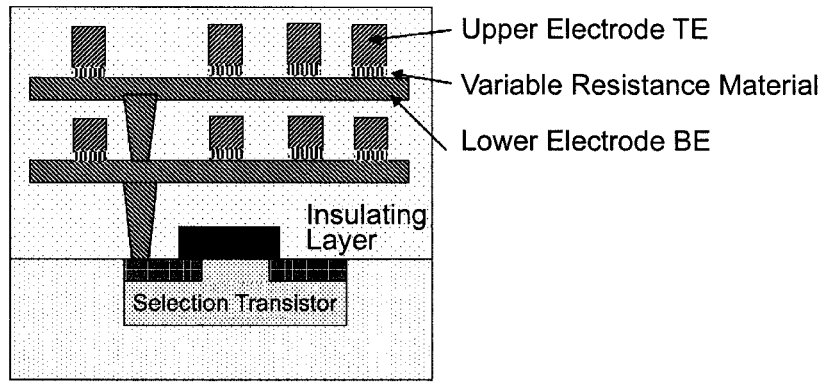
FIG. 3 is a schematic diagram of a semiconductor memory device in 1T1R configuration with an upper and a lower electrodes in the prior art.

In the above embodiments of the present disclosure, the present disclosure may have the following beneficial effects;

1. The present disclosure provides a 3D semiconductor memory device having 1T1R memory configuration based on a vertical-type gate-around transistor. The 3D semiconductor memory device can control on/off current ratio by changing a perimeter of the surrounding gate and a channel length in a vertical direction of the surrounding gate, so as to facilitate multi-state operation of the 1T1R memory cell. Moreover, the vertical transistor has a smaller layout size than a horizontal transistor. For example, left side of FIG. 2 shows a conventional bit line contact, i.e. a source contact of the selection transistor, which is disposed under the transistor, so as to reduce the layout size effectively. Thus, the 3D semiconductor memory device can be integrated into an array with a high density.

2. In the novel structure of the present disclosure, the 3D integration of the variable resistance units may be performed using a low temperature process, after the transistor is formed. This memory array may have an improved reliability than the 1D1R memory configuration.

3. The present disclosure provides a replacement electrode process which is performed in a variable resistance region. A size (height) of the annular variable resistance memory area may be controlled by changing a thickness of the stack of sacrificial $SiO_2/SiN/SiO_2$. A size (thickness) of the electrode and the variable resistance material may be controlled by controlling an etching back process of the metal and the variable resistance material. Compared to a conventional 3D variable resistance process flow, including deposition of the variable resistance unit→etching→deposition of the variable resistance unit→etching→ . . . , only one step of etching is performed. The replacement electrode process is very simple, low-cost and more suitable for process integration.

While the disclosure has been described with reference to specific embodiments, the description is illustrative of the disclosure and is not to be considered as limiting the disclosure. Various modifications and applications may occur for those skilled in the art without departing from the true spirit and scope of the disclosure as defined by the appended claims.

We claim:

1. A 3D semiconductor memory device, comprising:
a substrate, and
a memory array consisting of one or more of memory cells located on the substrate, each string of memory cells comprising:
a vertical-type gate-around transistor, and
a vertical annular variable resistance unit, wherein
in a bit line direction, the vertical-type gate-around transistors of the adjacent vertical strings of memory cells have a common source region, gates of the vertical-type gate-around transistors are isolated by an insulating layer, and upper electrodes of the vertical annular variable resistance units are isolated by the insulating layer, the common source region functioning as the bit line of the strings of memory cells;
in a word line direction, the source regions of the vertical-type gate-around transistors of the adjacent vertical strings of memory cells are isolated by a shallow trench isolation, the gates of the vertical-type gate-around transistors are connected to each other, and the upper electrodes of the vertical annular variable resistance units are connected to each other; and
the vertical annular variable resistance unit comprises one or more annular resistance sub-units arranged in a vertical direction, the annular resistance sub-units each comprising a variable resistance function layer having an annular shape, and the variable resistance function layers of adjacent annular resistance sub-units are isolated from each other by the insulating layer.

2. The 3D semiconductor memory device according to claim 1, wherein the vertical-type gate-around transistor comprises;
the source region formed on the substrate;
a channel region formed on the source region perpendicular to the substrate;
a drain region funned between the channel region and the vertical annular variable resistance unit; and
a gate insulating layer and a gate, which are successively formed on a side surface of the channel region.

3. The 3D semiconductor memory device according to claim 2, wherein the annular resistance sub-unit further comprises:
a lower electrode formed on the drain of a respective vertical-type gate-around transistor, the one or more annular resistance sub-units corresponding to one vertical-type gate-around transistor having a common lower electrode, wherein the variable resistance function layer formed at a predetermined position on a side surface of the lower electrode, for distinguishing information states; and
an upper electrode formed on the variable resistance function layer, the upper electrodes of respective layers of the vertical annular variable resistance unit being insulated from each other, the upper electrodes of the annular resistance sub-units of the adjacent vertical annular variable resistance units being insulated from each other in the bit line direction and having a common connection to outside of the array in the word line direction.

4. The 3D semiconductor memory device according to claim 2, wherein in the vertical-type gate-around transistor, the source region is formed by ion implantation, or by forming a metal silicide, or by a buried metal layer;
the channel region is formed by etching the substrate, or by epitaxial growth or a deposition process;
the gate is formed by a "gate-first" process in which the gate is formed before formation of the channel, or by a "gate-last" process in which the channel is formed before formation of the gate;
the gate dielectric layer is formed by a deposition process; and
the drain region is formed by ion implantation, or by a silicidation process, or by a metal deposition process.

5. The 3D semiconductor memory device according to claim 4, wherein
the channel region is made of one selected from a group consisting of silicon, polysilicon and germanium;
the gate is made of one selected from a group consisting of polysilicon, metal and metal silicide; and
the gate dielectric layer is made of one selected from a group consisting of $SiO_2$ and $SiO_xN_y$.

6. The 3D semiconductor memory device according to claim 3, wherein
the lower electrode comprises a single-layer metal, or a bilayer structure of a metal passivation layer and a metal layer;
the variable resistance function layer is formed by depositing a single-layer variable resistance material or a multi-layer variable resistance material, and is implemented by phase change of the material of the variable resistance function layer.

7. The 3D semiconductor memory device according to claim 6, wherein the lower electrode is made of one selected from a group consisting of Ag, Au, Cu, W, Ti, Pt, Ti, Ta, TiN, TaN and WN;
the variable resistance function layer is made of one selected from a group consisting of $Pr_{1-x}Ca_xMnO_3$, wherein $0<x<1$, $SrTiO_3$, $SrZrO_3$, $HfO_2$, $CuO_2$, $TiO_2$, $ZrO_2$, $NiO_x$, wherein $0<x<2$, $Nb_2O_5$, MoO, $Ge_2Sb_2Te_5$, GeTe and GeTeC;
the upper electrode is made of one selected from a group consisting of Ag, Au, Cu, W, Ti, Pt, Ti, Ta, TiN, TaN and WN.

8. A method for manufacturing a 3D semiconductor memory device, comprising;
  forming a vertical-type gate-around transistor on a substrate; and
  forming a vertical annular variable resistance unit on the substrate on which the vertical-type gate-around transistor has been formed, so that manufacture of the 3D semiconductor memory device is completed, wherein the forming the vertical annular variable resistance unit comprises forming one or more annular resistance sub-units arranged in a vertical direction, the annular resistance sub-units each comprising a variable resistance function layer having an annular shape, and the variable resistance function layers of adjacent annular resistance sub-units are isolated from each other.

9. The method for manufacturing a 3D semiconductor memory device according to claim 8, wherein the step of forming the vertical-type gate-around transistor on the substrate comprises;
  forming a shallow trench isolation on the substrate to define a bit line area;
  forming a bit line on the bit line area by ion implantation or a silicidation process;
  depositing a stack of $SiO_2$ insulating layer/SiN sacrificial layer/$SiO_2$ insulating layer on the substrate on which the bit line has been formed;
  forming a via hole by etching the bit line area of the substrate on which the stack of $SiO_2$/SiN/$SiO_2$ is deposited, so as to define a channel region;
  forming a channel by epitaxial growth on the substrate on which the channel region is defined, or forming a channel region in the via hole by deposition and annealing;
  forming a drain region by ion implantation;
  etching the substrate on which the drain region is formed, so as to define a word line area;
  removing the SiN sacrificial layer from the substrate on which the word line area is formed;
  depositing and etching back a gate dielectric and a gate by a gate-last process on the substrate on which the SiN sacrificial layer is removed; and
  depositing an interlayer dielectric.

10. The method for manufacturing a 3D semiconductor memory device according to claim 9, wherein before the step of etching and defining the word line area, the method further comprises,
  forming a low-resistance drain contact region by deposition of metal and silicidation.

11. The method for manufacturing a 3D semiconductor memory device according to claim 9, wherein the step of forming the vertical annular variable resistance unit on the substrate on which the vertical-type gate-around transistor has been formed comprises;
  alternatively depositing a plurality of the insulating layers and the SiN sacrificial layers, and defining a size of the variable resistance unit by a thickness, a number of the layers of the sacrificial layers corresponding to a number of a annular resistance sub-units;
  defining a lower electrode area of the variable resistance unit by etching through the via hole, the lower electrode area connecting downwards to the drain of the vertical-type gate-around transistor;
  depositing a metal passivation layer and lower electrode metal in the via hole;
  etching the stack in a word line direction to define a size of an upper electrode of the variable resistance unit;
  removing the SiN sacrificial layer;
  depositing the variable resistance function layer and the upper electrode, and etching back to provide isolation between units; and
  depositing the interlayer dielectric, and providing metal wires.

12. The 3D semiconductor memory device according to claim 1, wherein the upper electrodes of the vertical annular variable resistance units are surrounded directly by the insulating layer.

* * * * *